(12) United States Patent
Sandoh et al.

(10) Patent No.: US 11,056,346 B2
(45) Date of Patent: Jul. 6, 2021

(54) WAFER PROCESSING METHOD

(71) Applicant: DISCO CORPORATION, Tokyo (JP)

(72) Inventors: Hideyuki Sandoh, Tokyo (JP); Ichiro Yamahata, Tokyo (JP); Tomotaka Tabuchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/999,513

(22) Filed: Aug. 21, 2020

(65) Prior Publication Data
US 2021/0057225 A1 Feb. 25, 2021

(30) Foreign Application Priority Data

Aug. 22, 2019 (JP) .............................. JP2019-151803

(51) Int. Cl.
*H01L 21/304* (2006.01)
*H01L 21/3065* (2006.01)

(52) U.S. Cl.
CPC ........ *H01L 21/304* (2013.01); *H01L 21/3065* (2013.01)

(58) Field of Classification Search
None
See application file for complete search history.

(56) References Cited

U.S. PATENT DOCUMENTS

2018/0197825 A1* 7/2018 Yoshida .............. H01L 29/0619

FOREIGN PATENT DOCUMENTS

JP 2007158239 A 6/2007

* cited by examiner

*Primary Examiner* — Roberts P Culbert
(74) *Attorney, Agent, or Firm* — Greer Burns & Crain Ltd.

(57) ABSTRACT

There is provided a wafer processing method for reducing a thickness of a wafer. The wafer has a front side and a back side opposite to the front side. The wafer has a device area where a plurality of devices are formed on the front side and a peripheral marginal area including a curved peripheral edge. A protective layer for covering the plural devices are formed on the front side in the device area. The wafer processing method includes a plasma etching step of supplying an etching gas in a plasma condition to the front side of the wafer by using the protective layer as a mask, thereby removing the peripheral marginal area including the curved peripheral edge, a protective member attaching step of attaching a protective member to the front side of the wafer, and a grinding step of grinding the back side of the wafer.

3 Claims, 5 Drawing Sheets

WAFER PROCESSING METHOD

BACKGROUND OF THE INVENTION

Field of the Invention

The present invention relates to a wafer processing method for reducing the thickness of a wafer to a predetermined thickness.

Description of the Related Art

In a device chip fabrication process, a wafer having a plurality of devices such as integrated circuits (ICs) and large scale integrated circuits (LSIs) on the front side is used, in which the plural devices are individually formed in a plurality of separate regions defined by a plurality of crossing division lines (streets) formed on the front side of the wafer. By dividing this wafer along the division lines, a plurality of device chips including the plural respective devices are obtained. These device chips are mounted in various electronic equipment such as mobile phones and personal computers. In recent years, it has been required to reduce the thickness of each device chip in association with a reduction in size and thickness of electronic equipment. To meet this requirement, a step of grinding the back side of the wafer is performed before dividing the wafer, thereby reducing the thickness of the wafer. The wafer is ground by using a grinding apparatus including a chuck table for holding the wafer and a grinding unit having a plurality of abrasive members for grinding the wafer.

The wafer to be used in manufacturing the device chips is previously processed by so-called chamfering such that the peripheral portion of the wafer is ground to form the peripheral edge (side surface) of the wafer into an arcuate shape as viewed in cross section. When the wafer having a chamfered peripheral edge is ground to be thinned, the shape of the peripheral portion of the wafer becomes a so-called knife edge shape sharply projecting in the radially outward direction of the wafer. When the shape of the peripheral portion of the wafer becomes such a knife edge shape, any damage such as chipping and breaking is prone to occur in the peripheral portion of the wafer. Further, there is a possibility that this damage occurred in the peripheral portion of the wafer may proceed radially inward of the wafer and reach a device area where the plural devices are formed. As a result, there arises a problem such that the damage may be left in the device chips obtained by dividing the wafer, causing a reduction in quality of the device chips. To cope with this problem, so-called edge trimming is performed to the wafer before grinding the wafer to reduce the thickness of the wafer. The edge trimming is a step of annularly cutting the peripheral portion of the wafer from the front side thereof by using a cutting blade to thereby form a step portion in the peripheral portion of the wafer (see Japanese Patent Laid-Open No. 2007-158239). By performing this edge trimming, the shape of the peripheral portion of the wafer does not become a knife edge shape after grinding the back side of the wafer to reduce the thickness of the wafer. Accordingly, the damage occurring in the peripheral portion of the wafer can be suppressed.

SUMMARY OF THE INVENTION

As described above, the edge trimming is performed by using a cutting blade to cut the peripheral portion of the wafer. However, when the peripheral portion of the wafer is cut by using the cutting blade, a large amount of dust (cutting dust) due to cutting is generated and adheres to the wafer. The cutting dust adhering to the wafer causes defective operation of the devices or defective bonding of the devices. Accordingly, a cleaning step of cleaning the wafer to remove the cutting dust is performed after performing the edge trimming. However, when the large amount of cutting dust strongly adheres to the wafer, the time required for cleaning of the wafer is increased to cause a reduction in processing efficiency of the wafer.

Further, in the case of forming the step portion in the peripheral portion of the wafer by using the cutting blade as mentioned above, the peripheral portion of the wafer is cut by the cutting blade in the condition where only one side surface of the cutting blade is in contact with the wafer. As a result, the cutting blade is subjected to partial wear such that only one side surface of the cutting blade is worn. Accordingly, in performing the edge trimming, it is necessary to select suitable cutting conditions (e.g., depth of cut by the cutting blade) in consideration of this partial wear of the cutting blade. Further, in the case that the partial wear has occurred in the cutting blade, a special dressing step of dressing the cutting blade must be performed to eliminate the partial wear. As a result, the time and effort required for the edge trimming are increased to cause a reduction in processing efficiency of the wafer.

It is therefore an object of the present invention to provide a wafer processing method which can suppress a reduction in processing efficiency.

In accordance with an aspect of the present invention, there is provided a wafer processing method for reducing a thickness of a wafer to a predetermined thickness, the wafer having a front side and a back side opposite to the front side, the wafer having a device area where a plurality of devices are formed on the front side and a peripheral marginal area surrounding the device area and including a curved peripheral edge, a protective layer for covering the plurality of devices being formed on the front side in the device area, the protective layer being not formed in the peripheral marginal area. The wafer processing method includes a plasma etching step of supplying an etching gas in a plasma condition to the front side of the wafer by using the protective layer as a mask, thereby removing the peripheral marginal area including the curved peripheral edge such that a depth of an etched portion of the peripheral marginal area becomes larger than the predetermined thickness, a protective member attaching step of attaching a protective member to the front side of the wafer after performing the plasma etching step, and a grinding step of holding the wafer through the protective member on a chuck table included in a grinding apparatus and then grinding the back side of the wafer to thereby reduce the thickness of the wafer to the predetermined thickness.

Preferably, the protective layer includes a passivation film or a photoresist film formed on the front side of the wafer in a step of forming the plurality of devices. Preferably, the protective layer is formed such that an interdevice area between any adjacent ones of the plurality of devices on the front side of the wafer is exposed, and the plasma etching step includes the step of supplying the etching gas in the plasma condition to the front side of the wafer by using the protective layer as the mask, thereby removing the peripheral marginal area and also forming a groove along the interdevice area in the device area on the front side of the wafer, the groove having a depth larger than the predetermined thickness.

As described above, the wafer processing method according to the present invention includes the step of supplying an etching gas in a plasma condition to the front side of the wafer to thereby remove the peripheral marginal area. That is, edge trimming is performed to the wafer by using plasma etching rather than cutting with a cutting blade. By using the wafer processing method according to the present invention, it is possible to eliminate the problem occurring in the case of performing edge trimming to the wafer by using a cutting blade. That is, there is no possibility that a large amount of cutting dust may adhere to the wafer according to the present invention. Accordingly, a cleaning step of cleaning the wafer after performing the edge trimming can be simplified. Further, it is not necessary to select the cutting conditions in consideration of the partial wear of the cutting blade and also to perform a dressing step of dressing the cutting blade partially worn. Accordingly, a reduction in processing efficiency of the wafer can be suppressed.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
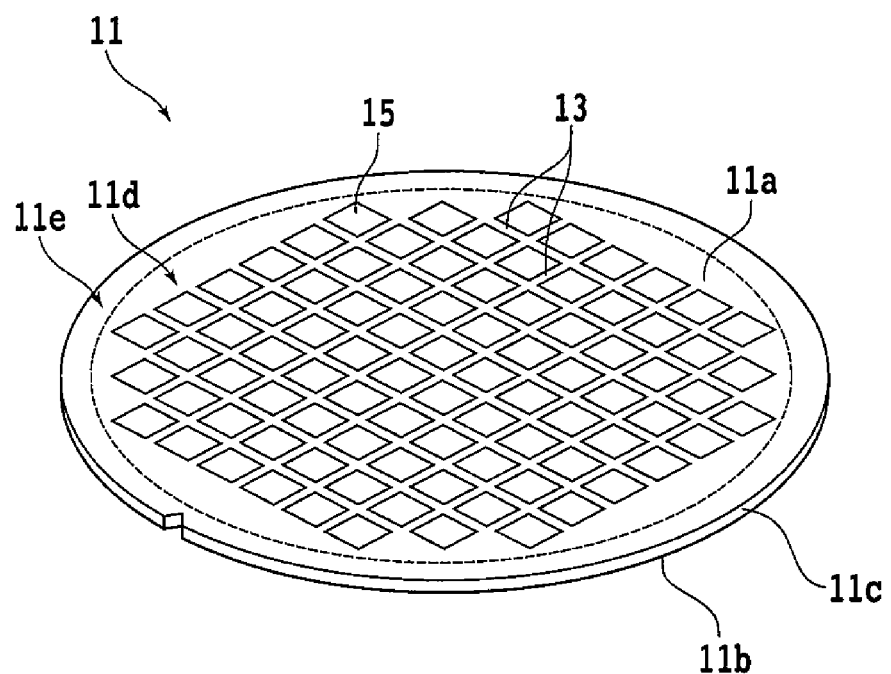
FIG. 1A is a perspective view depicting a wafer.
Figure 1B:
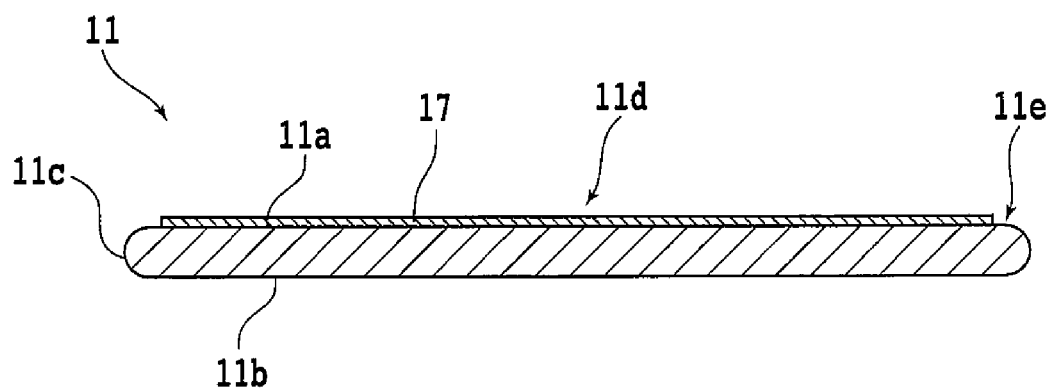
FIG. 1B is a sectional view of the wafer depicted in FIG. 1A.

A preferred embodiment of the present invention will now be described with reference to the attached drawings. There will first be described the configuration of a wafer that can be processed by a wafer processing method according to this preferred embodiment. FIG. 1A is a perspective view depicting a wafer 11 usable in this preferred embodiment, and FIG. 1B is a sectional view of the wafer 11 depicted in FIG. 1A.

The wafer 11 is a disk-shaped silicon wafer, for example. The wafer 11 has a front side 11a, a back side 11b opposite to the front side 11a, and a peripheral edge (side surface) 11c connected to the front side 11a and the back side 11b. A plurality of crossing division lines (streets) 13 are formed on the front side 11a of the wafer 11 to thereby define a plurality of rectangular separate regions where a plurality of devices 15 such as ICs and LSIs are individually formed. That is, the plural devices 15 are previously formed on the front side 11a of the wafer 11 in a device forming step. By dividing the wafer 11 along the plural division lines 13, a plurality of device chips including the plural respective devices 15 can be obtained. The wafer 11 is not limited in material, shape, structure, size, etc. For example, the wafer 11 may be formed of any semiconductors (e.g., gallium arsenide (GaAs), indium phosphide (InP), gallium nitride (GaN), silicon carbide (SiC)) other than silicon. Further, the wafer 11 may also be formed of glass, ceramic, resin, or metal, for example. The wafer 11 may have any shape and size which are freely selected. Further, the devices 15 are not limited in kind, number, shape, structure, size, layout, etc.

The wafer 11 is previously chamfered so as to remove an angular portion formed on the peripheral edge 11c of the wafer 11. Accordingly, the peripheral edge 11c of the wafer 11 is curved between the front side 11a of the wafer 11 and the back side 11b of the wafer 11 as depicted in FIG. 1B. More specifically, in this preferred embodiment depicted in FIG. 1B, the peripheral edge 11c of the wafer 11 is rounded between the front side 11a and the back side 11b so as to describe an arc having a center at a radially inside position in the wafer 11. The wafer 11 has a circular device area 11d (as viewed in plan) where the plural devices 15 are formed and an annular peripheral marginal area 11e (as viewed in plan) where the devices 15 are not formed, in which the circular device area 11d is surrounded by the annular peripheral marginal area 11e. The peripheral marginal area 11e corresponds to an area to be finally removed after dividing the wafer 11 into a plurality of device chips and includes the peripheral edge 11c of the wafer 11. In FIG. 1A, the boundary between the device area 11d and the peripheral marginal area 11e is depicted by a broken line. The shape of the device area 11d and the shape of the peripheral marginal area 11e are different according to the shape of each device 15 and the layout of the plural devices 15.

Prior to dividing the wafer 11, the wafer 11 is thinned for the purpose of thinning each device chip. This thinning of the wafer 11 is performed by using a grinding apparatus to grind the back side 11b of the wafer 11. As depicted in FIG. 1B, a protective layer (mask layer) 17 is formed on the front side 11a of the wafer 11 (the protective layer being not depicted in FIG. 1A). The protective layer 17 is formed on the front side 11a of the wafer 11 so as to cover the device area 11d (the plural devices 15). That is, the protective layer 17 is not formed on the front side 11a in the peripheral marginal area 11e, so that the front side 11a in the peripheral marginal area 11e is exposed.

The protective layer 17 functions to cover the device area 11d (the plural devices 15), thereby protecting the plural devices 15 and also functions as a mask in performing plasma etching to the wafer 11 in a plasma etching step to be hereinafter described. As this protective layer 17, a layer formed in the device forming step of forming the plural devices 15 may be used. For example, in the device forming step of forming the plural devices 15, there is a case that a passivation film for protecting the plural devices 15 is formed so as to cover the device area 11d. Further, in this device forming step, there is a case that a photoresist film for patterning a conductive film and an insulating film constituting each device 15 is formed so as to cover the device area 11d. The passivation film or the photoresist film formed on the device area 11d may be used as the protective layer 17 in the case that the passivation film or the photoresist film is formed of a material such that the etching selective ratio between the wafer 11 and the passivation film or the photoresist film can be suitably ensured in a later plasma etching step. In this case, it is not necessary to separately form the protective layer 17, so that the number of steps can be reduced and cost can also be reduced. For example, a passivation film formed of an inorganic material such as silicon oxide ($SiO_2$) and silicon nitride (SiN) or a photoresist film formed of a photosensitive resin may be used as the protective layer 17.

Figure 2A:
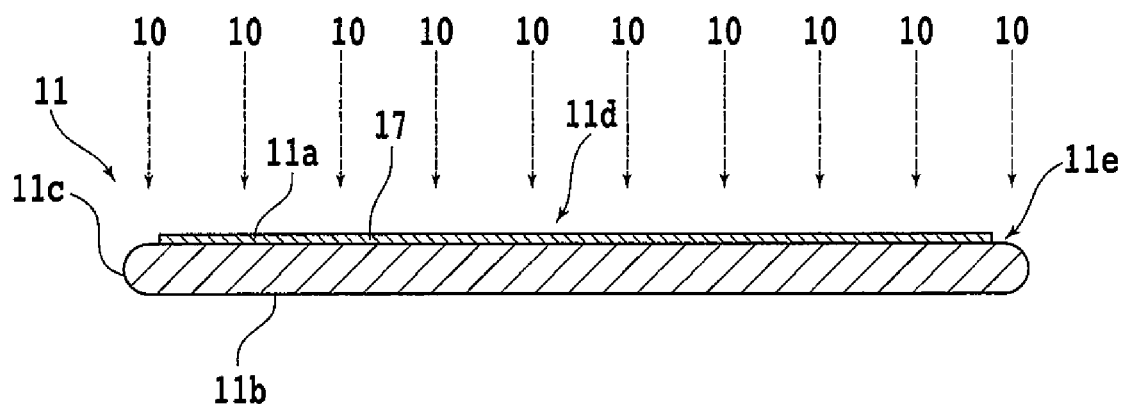
FIG. 2A is a sectional view of the wafer in a plasma etching step.

After forming the protective layer 17 as a mask described above, an etching gas in a plasma condition is supplied to the front side 11a of the wafer 11 to thereby etch the peripheral marginal area 11e and thereby remove the peripheral marginal area 11e including the peripheral edge 11c (plasma etching step). FIG. 2A is a sectional view of the wafer 11 in the plasma etching step.

The plasma etching step is performed by using a plasma etching apparatus for dissociating an etching gas 10 to produce a plasma and then supplying this plasma to the front side 11a of the wafer 11. The plasma etching apparatus includes a chamber (etching chamber) containing a chuck table (holding table) having a holding surface for holding the wafer 11. The etching gas 10 is dissociated in this chamber to become a plasma, and this plasma is supplied to the front side 11a of the wafer 11 held by the chuck table. Alternatively, the etching gas 10 is dissociated outside the chamber to become a plasma, and this plasma is introduced into this chamber and supplied to the front side 11a of the wafer 11 held by the chuck table. In the case that the wafer 11 is a silicon wafer, for example, the etching gas 10 including a fluorine-containing gas such as tetrafluoromethane ($CF_4$) and sulfur hexafluoride ($SF_6$) is dissociated by the plasma etching apparatus to produce a plasma, which is next supplied to the front side 11a of the wafer 11. This plasma, the etching gas 10 in the plasma condition, acts on the wafer 11 to etch the wafer 11. However, the components of the etching gas 10 are suitably selected according to the material of the wafer 11 and the material of the protective layer 17.

In performing the plasma etching, the wafer 11 is first held by the chuck table in the condition where the back side 11b of the wafer 11 is opposed to the holding surface of the chuck table and the front side 11a of the wafer 11 is exposed upward. Thereafter, the etching gas 10 in a plasma condition is supplied to the wafer 11 from the upper side thereof, that is, supplied to the front side 11a of the wafer 11. The device area 11d of the wafer 11 is previously covered with the protective layer 17. That is, the peripheral marginal area 11e of the wafer 11 is not covered with the protective layer 17, but exposed. Accordingly, the etching gas 10 acts on the front side 11a of the peripheral marginal area 11e of the wafer 11, thereby partially removing the peripheral marginal area 11e. Thus, the plasma etching is performed to the front side 11a of the wafer 11 with the protective layer 17 used as a mask.

Figure 2B:
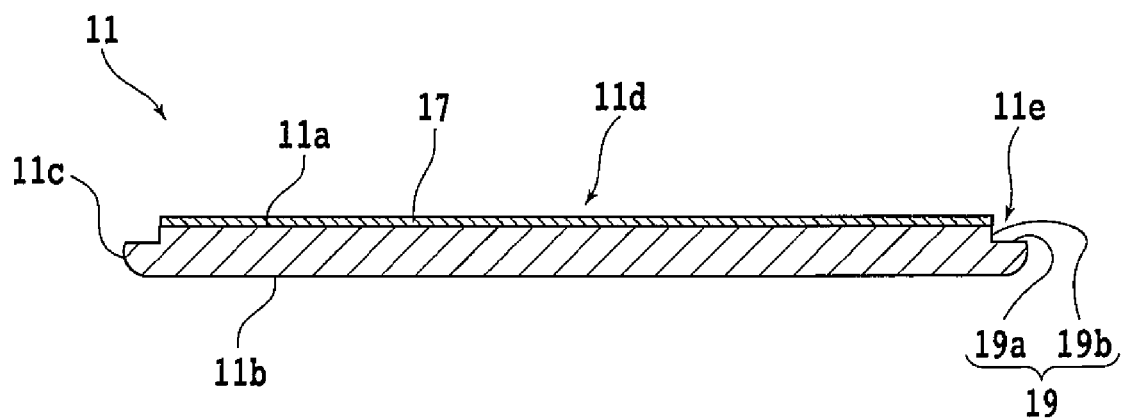
FIG. 2B is a sectional view of the wafer in the condition obtained by the plasma etching step.

FIG. 2B is a sectional view of the wafer 11 in the condition obtained by the plasma etching step. When the wafer 11 is processed by the plasma etching, a part of the peripheral marginal area 11e is removed together with the peripheral edge 11c, so that a step portion (etched portion) 19 is formed in the peripheral marginal area 11e. The step portion 19 includes an annular bottom surface (bottom) 19a and an annular side surface 19b connected to the inner circumference of the annular bottom surface 19a. The bottom surface 19a is substantially parallel to the front side 11a and the back side 11b of the wafer 11. The bottom surface 19a is formed at a level lower than that of the front side 11a. The side surface 19b is substantially parallel to the direction along the thickness of the wafer 11. The side surface 19b is formed so as to connect the front side 11a of the wafer 11 and the bottom surface 19a at a position corresponding to the boundary between the device area 11d and the peripheral marginal area 11e. The shape of the step portion 19 is not necessarily limited to the shape depicted in FIG. 2B. For example, the step portion 19 may have a curved shape such that the bottom surface 19a and the side surface 19b are continuously connected so as to form a curved surface, depending upon the conditions of the plasma etching.

The difference in height between the front side 11a of the wafer 11 processed by the plasma etching and the bottom (bottom surface 19a) of the step portion 19 corresponds to the depth of a part (etched portion) of the peripheral marginal area 11e removed by the plasma etching. That is, this difference in height corresponds to the amount of removal of the peripheral marginal area 11e by the plasma etching. In the plasma etching step, the amount of removal of the peripheral marginal area 11e is controlled such that it becomes larger than the thickness of the wafer 11 (finished thickness of the wafer 11) thinned by grinding in a grinding step (see FIG. 4) which will be hereinafter described.

In the plasma etching step, the step portion 19 may be formed by a so-called Bosch process such that isotropic etching of the wafer 11, formation of a protective film, and anisotropic etching of the wafer 11 are repeated. In this case, even when the amount of removal of the peripheral marginal area 11e is large, the step portion 19 can be formed deeply along the thickness of the wafer 11.

Figure 3:
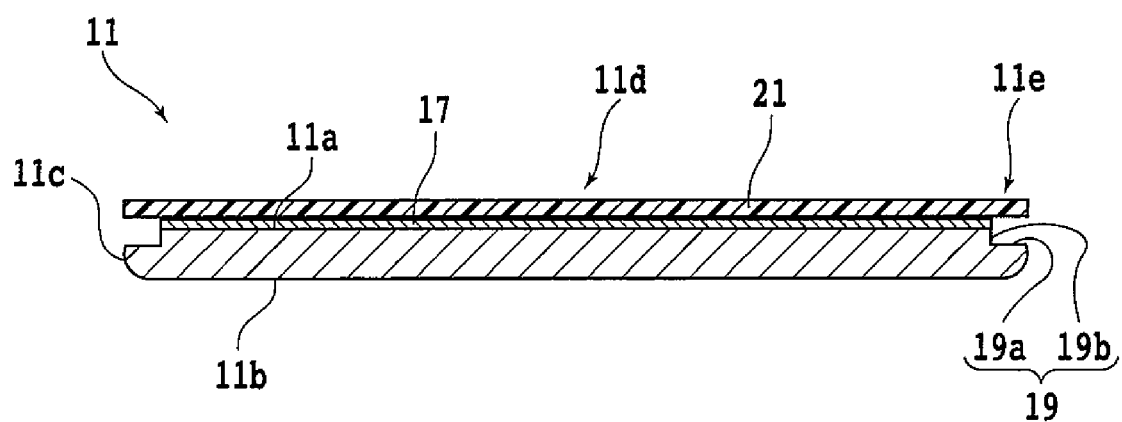
FIG. 3 is a sectional view of the wafer in a protective member attaching step.

After performing the plasma etching step, a protective member is attached to the front side 11a of the wafer 11 (protective member attaching step). FIG. 3 is a sectional view of the wafer 11 in the protective member attaching step. In the protective member attaching step, a circular protective member 21 having the same diameter as that of the wafer 11, for example, is attached through the protective layer 17 to the front side 11a of the wafer 11 as depicted in FIG. 3. The protective member 21 is attached to the protective layer 17 so as to essentially cover the whole of the device area 11d of the wafer 11 and the whole of the protective layer 17. Accordingly, the front side 11a of the wafer 11 and the plural devices 15 are protected by the protective member 21 in next performing a grinding step. As a modification, the protective member 21 may be attached directly to the front side 11a of the wafer 11 after removing the protective layer 17 from the front side 11a of the wafer 11.

As the protective member 21, a flexible protective tape formed of resin may be used, for example. More specifically, the protective member 21 includes a circular base sheet and an adhesive layer (paste layer) formed on the base sheet. The base sheet is formed of resin such as polyolefin, polyvinyl chloride, and polyethylene terephthalate. The adhesive layer is formed of epoxy adhesive, acrylic adhesive, or rubber adhesive, for example. The adhesive layer may also be formed of a ultraviolet (UV) curing resin curable by applying UV irradiation. However, the material of the protective member 21 is not limited as long as it can protect the front side 11a of the wafer 11 and the plural devices 15. For example, the protective member 21 may be a plate-shaped rigid substrate formed of silicon, glass, or ceramic.

Figure 4:
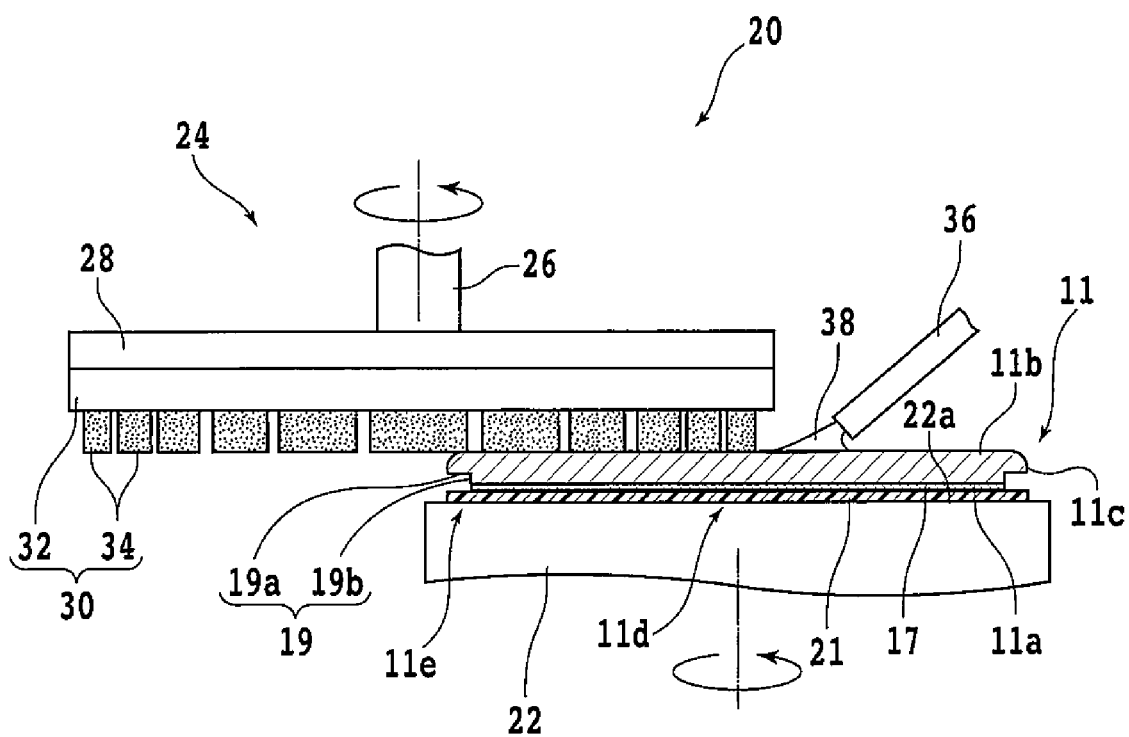
FIG. 4 is a partially sectional elevation view of the wafer in a grinding step.

After performing the protective member attaching step, the back side 11b of the wafer 11 is ground to reduce the thickness of the wafer 11 to a predetermined thickness (grinding step). FIG. 4 is a partially sectional elevation view of the wafer 11 in the grinding step. In the grinding step, a grinding apparatus 20 for grinding the wafer 11 is used as depicted in FIG. 4. The grinding apparatus 20 includes a chuck table (holding table) 22 for holding the wafer 11 and a grinding unit 24 for grinding the wafer 11 held by the chuck table 22.

The chuck table 22 has an upper surface as a holding surface 22a for holding the wafer 11. The holding surface 20a has a size and shape capable of holding the whole of the front side 11a of the wafer 11 (the whole of the protective layer 17 and the whole of the protective member 21). For example, in the case that the disk-shaped wafer 11 is ground, the holding surface 22a has a circular shape and has a diameter larger than that of the wafer 11 so as to support the shape and size of the wafer 11. The holding surface 22a is connected through a suction passage (not depicted) to a vacuum source (not depicted) such as an ejector, in which the suction passage is formed inside the chuck table 22. Also, the chuck table 22 is connected to a rotational drive source (not depicted) such as a motor, so that the chuck table 22 is rotated about its axis substantially parallel to a vertical direction by operating this rotational drive source. Further, the chuck table 22 is connected to a moving mechanism (not depicted), so that the chuck table 22 is moved in a horizontal direction by operating this moving mechanism.

The grinding unit 24 is located above the chuck table 22. The grinding unit 24 includes a cylindrical housing (not depicted) vertically movable by a moving mechanism (elevating mechanism not depicted). A cylindrical spindle 26 as a rotating shaft is rotatably supported in this housing. The spindle 26 has an axis substantially parallel to a vertical direction. A lower end portion of the spindle 26 projects from the lower end of the housing, and a disk-shaped mount 28 is fixed to the lower end of the spindle 26.

A grinding wheel 30 is mounted on the lower surface of the mount 28. The grinding wheel 30 has a diameter substantially equal to the diameter of the mount 28. The grinding wheel 30 includes an annular base 32 formed of metal such as stainless steel and aluminum. The upper surface of the annular base 32 is fixed to the lower surface of the mount 28. The grinding wheel 30 further includes a plurality of abrasive members 34 fixed to the lower surface of the base 32. Each abrasive member 34 has a shape like a rectangular prism. The plural abrasive members 34 are arranged at substantially equal intervals along the outer circumference of the base 32. The lower surface of each abrasive member 34 is adapted to come into contact with the wafer 11, thereby grinding the wafer 11. A rotational drive source (not depicted) such as a motor is connected to the upper end (base end) of the spindle 26, so that the spindle 26 is rotated about its axis by operating this rotational drive source. Accordingly, the grinding wheel 30 is rotated about its axis coinciding with the axis of the spindle 26 by the torque transmitted from the rotational drive source through the spindle 26 and the mount 28.

A nozzle 36 is provided in the vicinity of the grinding unit 24. The nozzle 36 functions to supply a grinding fluid 38 such as pure water to the wafer 11 held by the chuck table 22 and to the plural abrasive members 34. That is, in grinding the wafer 11 by using the plural abrasive members 34, the grinding fluid 38 is supplied from the nozzle 36 to the wafer 11 and the plural abrasive members 34.

In performing the grinding step of grinding the wafer 11 by using the grinding apparatus 20, the wafer 11 is first held by the chuck table 22. More specifically, the wafer 11 is placed on the chuck table 22 in the condition where the front side 11a of the wafer 11 is opposed to the holding surface 22a of the chuck table 22, that is, the protective member 21 attached through the protective layer 17 to the front side 11a is in contact with the holding surface 22a, and the back side 11b of the wafer 11 is exposed upward. In this condition, a vacuum produced by the vacuum source is applied to the holding surface 22a of the chuck table 22, so that the wafer 11 is held under suction through the protective layer 17 and the protective member 21 on the holding surface 22a of the chuck table 22.

Thereafter, the chuck table 22 holding the wafer 11 is moved to the position below the grinding unit 24. Thereafter, the chuck table 22 is rotated about its axis in a predetermined direction (e.g., counterclockwise as viewed in top plan) at a predetermined speed, and the grinding wheel 30 is also rotated about its axis in a predetermined direction (e.g., counterclockwise as viewed in top plan) at a predetermined speed. Thereafter, the grinding wheel 30 is lowered toward the chuck table 22 at a predetermined feed speed. This predetermined feed speed of the grinding wheel 30 is adjusted such that the plural abrasive members 34 are pressed on the back side 11b of the wafer 11 by a suitable force. In this manner, the plural abrasive members 34 of the grinding wheel 30 being rotated come into pressure contact with the back side 11b of the wafer 11, thereby grinding the back side 11b of the wafer 11. Thus, the wafer 11 is ground to reduce the thickness of the wafer 11. When the thickness of the wafer 11 is reduced to a predetermined thickness (finished thickness), the grinding of the wafer 11 is stopped. In grinding the wafer 11 by using the plural abrasive members 34, the grinding fluid 38 is supplied from the nozzle 36 to the wafer 11 and the plural abrasive members 34. By supplying the grinding fluid 38, the wafer 11 and the plural abrasive members 34 are cooled by the grinding fluid 38, and dust (grinding dust) generated in grinding the wafer 11 is washed away by the grinding fluid 38.

Figure 5:
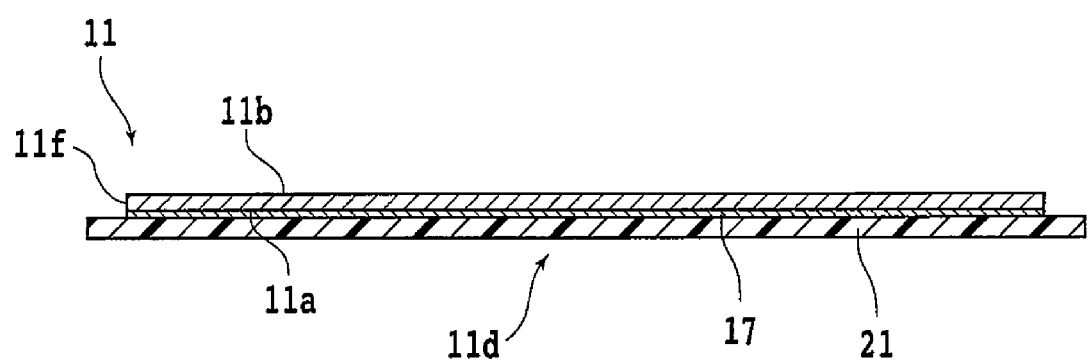
FIG. 5 is a sectional view of the wafer in the condition obtained by the grinding step.

FIG. 5 is a sectional view of the wafer 11 in the condition obtained by the grinding step. In the grinding step, the back side 11b of the wafer 11 is ground until the thickness of the wafer 11 is reduced to the finished thickness, so that the peripheral marginal area 11e including the peripheral edge 11c chamfered is removed as depicted in FIG. 5. In the condition obtained by performing the grinding step, the wafer 11 has a new peripheral edge (side surface) 11f as a flat surface substantially perpendicular both to the front side 11a of the wafer 11 and to the back side 11b of the wafer 11 as depicted in FIG. 5.

If the plasma etching mentioned above is not performed, that is, if the step portion 19 (see FIG. 2B) is not formed on the wafer 11, a part of the peripheral marginal area 11e of the wafer 11 is left by grinding the back side 11b of the wafer 11 in the grinding step. This part of the peripheral marginal area 11e left above has a so-called knife edge shape sharply projecting in the radially outward direction of the wafer 11. When the shape of the peripheral marginal area 11e becomes such a knife edge shape, any damage such as chipping and breaking is prone to occur in the peripheral marginal area 11e. Further, there is a possibility that this damage occurred in the peripheral marginal area 11e may proceed radially inward of the wafer 11 and reach the device area 11d. As a result, there arises a problem such that the damage may be left in the device chips obtained by dividing the wafer 11, causing a reduction in quality of the device chips.

In contrast, when the wafer 11 is processed by so-called edge trimming to form the step portion 19 along the outer circumference of the wafer 11, the peripheral marginal area 11e of the wafer 11 in the condition obtained by the grinding step becomes the peripheral edge 11f as a flat surface as depicted in FIG. 5. That is, the knife edge shape is eliminated in the condition obtained by the grinding step. Accordingly, the damage in the peripheral portion of the wafer 11 can be prevented, so that it is possible to prevent a reduction in quality of the device chips due to the transmission of the damage to the device area 11d.

After performing the grinding step, the wafer 11 is divided along the division lines 13 (see FIG. 1A), thereby manufacturing the plural device chips including the plural respective devices 15. Since the wafer 11 is thinned by the grinding step, the thickness of each device chip obtained by dividing the thinned wafer 11 is small.

A method of dividing the wafer 11 is not limited. For example, a cutting apparatus may be used to divide the wafer 11. The cutting apparatus includes a chuck table (holding table) having a holding surface for holding the wafer 11 and a cutting unit having an annular cutting blade for cutting the wafer 11.

The cutting blade is composed of abrasive grains such as diamond abrasive grains and a bond for fixing the abrasive grains. Examples of the bond include a metal bond, resin bond, and vitrified bond. In dividing the wafer 11 by using this cutting apparatus, the wafer 11 is held on the holding surface of the chuck table, and the cutting blade mounted on the cutting unit is rotated. Thereafter, the cutting unit is moved to bring the cutting blade into contact with the wafer 11, that is, to cut the wafer 11 with the cutting blade. Thereafter, the chuck table is horizontally moved to thereby cut the wafer 11 along a predetermined one of the division lines 13. Thereafter, this cutting operation is similarly repeated to cut the wafer 11 along all of the other division lines 13. As a result, the wafer 11 is divided into the plural device chips.

As another method, a laser processing apparatus may also be used to divide the wafer 11. The laser processing apparatus includes a chuck table (holding table) having a holding surface for holding the wafer 11 and a laser applying unit for applying a laser beam to the wafer 11. The laser applying unit includes a laser oscillator for generating a pulsed laser beam and focusing means for focusing the pulsed laser beam generated from the laser oscillator to a predetermined position.

In dividing the wafer 11 by using the laser processing apparatus, the wafer 11 is held on the holding surface of the chuck table, and the laser beam is applied from the laser applying unit to the wafer 11 to thereby form a modified area (modified layer) inside the wafer 11. More specifically, the conditions of application of the laser beam, or the laser processing conditions (e.g., wavelength, power, spot diameter, and repetition frequency of the pulsed laser beam) are set such that the modified layer is formed inside the wafer 11 due to multiphoton absorption. Further, the focal point of the laser beam is positioned inside the wafer 11 (between the front side 11a and the back side 11b). By moving the chuck table, the laser beam is scanned along each division line 13 to thereby form the modified layer inside the wafer 11 along each division line 13. The area where the modified layer is formed is brittler than the other area of the wafer 11. Accordingly, when an external force is applied to the wafer 11 after forming the modified layer inside the wafer 11 along each division line 13, the wafer 11 is broken along each division line 13 and thereby divided into the plural device chips. In other words, the modified layer functions as a division start point (trigger for the division) in dividing the wafer 11.

The conditions of application of the laser beam may be set such that ablation is performed to the wafer 11. In this case, when the laser beam is scanned along each division line 13, the wafer 11 is divided along each division line 13 by ablation. In the case that it is difficult to divide the wafer 11 by one pass of scanning of the laser beam along each division line 13, the laser beam is scanned plural times along each division line 13.

As described above, the wafer processing method according to this preferred embodiment includes the step of supplying an etching gas in a plasma condition to the front side 11a of the wafer 11 to thereby remove the peripheral marginal area 11e. That is, edge trimming is performed to the wafer 11 by plasma etching rather than cutting with a cutting blade. By using the wafer processing method according to this preferred embodiment, it is possible to eliminate the problem occurring in the case of performing edge trimming to the wafer 11 by using a cutting blade. That is, there is no possibility that a large amount of cutting dust may adhere to the wafer 11 according to this preferred embodiment. Accordingly, a cleaning step of cleaning the wafer 11 after performing the edge trimming can be simplified. Further, it is not necessary to select the processing conditions in consideration of the partial wear of the cutting blade and also to perform a dressing step of dressing the cutting blade partially worn. Accordingly, a reduction in processing efficiency of the wafer 11 is suppressed.

In this preferred embodiment, etching is performed to only the peripheral marginal area 11e of the wafer 11 in the plasma etching step as mentioned above. As a modification, etching may be performed not only to the peripheral marginal area 11e, but also to the device area 11d along each division line 13 (interdevice area), thereby forming a groove extending along each division line 13 on the front side 11a. That is, the peripheral marginal area 11e and the device area 11d may be etched to thereby form the step portion 19 in the peripheral marginal area 11e and also form a groove along each division line 13 in the device area 11d. There will now be described a method of forming such a groove along each division line 13 in the device area 11d in addition to the step portion 19 in the peripheral marginal area 11e in the plasma etching step.

First, the protective layer 17 (see FIG. 1B) formed on the front side 11a of the wafer 11 is patterned so as to individually mask the plural devices 15. That is, the protective layer 17 is partially removed in an area corresponding to the plural division lines 13 isolating the plural devices 15. Accordingly, not only the peripheral marginal area 11e of the wafer 11, but also the plural division lines 13 formed on the front side 11a in the device area 11d are exposed. To ensure a margin for the plasma etching, the width of the crossing area (pattern) of the protective layer 17 to be removed so as to correspond to the crossing division lines 13 may be set smaller than the width of each division line 13.

After patterning the protective layer 17 as mentioned above, the plasma etching step (see FIG. 2A) is performed to supply the etching gas 10 through the protective layer 17 to the front side 11a of the wafer 11. Accordingly, both the peripheral marginal area 11e and the plural division lines 13 in the device area 11d are etched by the etching gas 10 in a plasma condition. As a result, the step portion 19 (see FIG. 2B) is formed in the peripheral marginal area 11e, and a plurality of linear crossing grooves having a lattice shape are formed along the plural division lines 13 in the device area 11d. This plasma etching is continued until the amount of removal of the peripheral marginal area 11e becomes larger than the finished thickness of the wafer 11, and the depth of each groove formed in the device area 11d also becomes larger than the finished thickness of the wafer 11.

Thereafter, the protective member attaching step and the grinding step are performed in a manner similar to that mentioned above with reference to FIGS. 3 and 4. When the thickness of the wafer 11 is reduced to the finished thickness in the grinding step, the groove formed along each division line 13 in the device area 11d in the plasma etching step is exposed (the bottom of each groove is exposed to the back side 11b of the wafer 11 ground). At the same time, the step portion 19 formed in the peripheral marginal area 11e is also removed to form the flat peripheral edge 11f. Thus, the wafer 11 is divided into the plural device chips respectively including the plural devices 15.

There is a case that a passivation film or a photoresist film patterned so as to mask the plural devices 15 is formed in the device forming step of forming the plural devices 15. In this case, the passivation film or the photoresist film may be used as the protective layer 17 having the pattern for the grooves.

In addition, the structure, method, etc. according to this preferred embodiment may be suitably modified without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for reducing a thickness of a wafer to a predetermined thickness, the wafer having a front side and a back side opposite to the front side, the wafer having a device area where a plurality of devices are formed on the front side and a peripheral marginal area surrounding the device area and including a curved peripheral edge, a protective layer for covering the plurality of devices being formed on the front side in the device area, the protective layer being not formed in the peripheral marginal area, the wafer processing method comprising:
   a plasma etching step of supplying an etching gas in a plasma condition to the front side of the wafer by using the protective layer as a mask, thereby removing the peripheral marginal area including the curved peripheral edge such that a depth of an etched portion of the peripheral marginal area becomes larger than the predetermined thickness;
   a protective member attaching step of attaching a protective member to the front side of the wafer after performing the plasma etching step; and
   a grinding step of holding the wafer through the protective member on a chuck table included in a grinding apparatus and then grinding the back side of the wafer to thereby reduce the thickness of the wafer to the predetermined thickness.

2. The wafer processing method according to claim 1, wherein
   the protective layer includes a passivation film or a photoresist film formed on the front side of the wafer in a step of forming the plurality of devices.

3. The wafer processing method according to claim 1, wherein
   the protective layer is formed such that an interdevice area between any adjacent ones of the plurality of devices on the front side of the wafer is exposed,
   the plasma etching step including the step of supplying the etching gas in the plasma condition to the front side of the wafer by using the protective layer as the mask, thereby removing the peripheral marginal area and also forming a groove along the interdevice area in the device area on the front side of the wafer, the groove having a depth larger than the predetermined thickness.

* * * * *